United States Patent [19]

Weber

[11] 4,348,597
[45] Sep. 7, 1982

[54] LATCHUP RESISTANT PSEUDORANDOM BINARY SEQUENCE GENERATOR

[76] Inventor: Harold J. Weber, 20 Whitney Dr., Sherborn, Mass. 01770

[21] Appl. No.: 153,401

[22] Filed: May 27, 1980

[51] Int. Cl.³ .............................................. H03K 3/84
[52] U.S. Cl. .................................. 307/269; 307/471; 307/221 R; 331/78
[58] Field of Search ................... 307/221 R, 269, 471; 331/78

[56] References Cited

U.S. PATENT DOCUMENTS

| | | | |
|---|---|---|---|
| 3,462,613 | 8/1969 | Wolf | 307/471 |
| 3,818,242 | 6/1974 | Freedman | 307/221 R |
| 4,039,960 | 8/1977 | Clark | 307/269 |
| 4,236,114 | 11/1980 | Sasaki | 307/471 |

Primary Examiner—John S. Heyman

[57] ABSTRACT

A pseudorandom binary sequence generator employing a conditional feedback path between several individual outputs and the input of a clocked shift register. Enhanced reistance to a latchup condition is brought about by way of a delay of one of the outputs, relative to the other outputs, as coupled to the feedback path.

9 Claims, 5 Drawing Figures

LATCHUP RESISTANT PSEUDORANDOM BINARY SEQUENCE GENERATOR

BACKGROUND OF INVENTION

The invention relates to latchup resistant pseudorandom sequence generators. Such generators usually include a shift register, together with steering logic generally satisfying the EXCLUSIVE-OR equation (or else EXCLUSIVE-NOR if the sense is inverted). The connection offers a long train of binary signal words from the several parallel shift register stage outputs which are random appearing, except that the random sequence repeats cyclically each time the full binary length of the shift register is reached.

This instant invention more particularly describes a novel arrangement of the generator elements which acts to resist latchup of the binary sequence, while using the least amount of circuitry. In particular the embodiment finds typical application in low cost, non-critical consumer devices such as taught in my U.S. Pat. No. 4,253,045 describing a "Flickering Flame Effect Electric Light Controller." The advantages of the present teaching will become apparent, in view of the low cost objectives of the typical application.

SUMMARY

The use of shift registers together with combinational logic usually serving an EXCLUSIVE-OR function is well known. The shift register is advanced by a train of clock pulses, with several of the shift register stage outputs coupled to an EXCLUSIVE-OR conditional gate function input. The gate output subsequently serves to couple to the DATA input of the shift register, thereby providing feedback. The result is, through proper hookup combination, the generation of a pseudorandom sequence of binary states which may extend to:

$$2^n - 1$$

in length, before repeating, with n=number of shift register stages.

A discussion of this kind of pseudorandom generator is provided by Lancaster in "C-MOS Cookbook," published by Howard W. Sams & Co., Inc., Indianapolis, Ind., Library of Congress Card No. 76-42874, on pages 318–323. Lancaster also shows the usual capacitor "C" and resistor "R" network coupled into the feedback loop, which acts to reset a latchup mode. Due to the presence of the capacitor in the feedback network, operation of the overall combination of shift register and gates is not direct coupled. The result is the capacitor coupled generator will not advance properly on very slow clock repetition rates. By way of example, the clock frequently "$F_{CK}$" generally must be higher than about:

$$F_{CK} > (1/R \cdot C)$$

for reliable performance. Omitting the resistor and capacitor and providing direct coupling of the gate output to the DATA input overcomes the minimum clock rate restriction. The clock may advance at any desired rate, from a few megahertz, to only a few pulses per minute or less without loosing sequence integrity. However, the direct coupling also enables the cofiguration to "latch-up," that is to establish all the same state outputs (LOW state for EXCLUSIVE-OR; HIGH state for EXCLUSIVE-NOR) which act to shift through the register ad infinitum. The latchup state appears most likely to occur when power is first applied, particularly when the shift register stages are nearly identical: as when they are all fabricated as a common monolythic circuit. The symmetry of the circuits leads all the outputs to simultaneously assume the same state condition.

Therefore it is a purpose of the invention to provide direct coupling from the shift register stages, through the steering logic in the feedback path, and to the shift register DATA input while maintaining good resistance against latchup.

Yet another purpose is to provide a shift register which resists latchup and yet may be clocked at very slow rates without loss of the pseudorandom sequence order.

Still another purpose is to teach a latchup resistant circuit which is particularly adaptable to monolythic, integrated circuit fabrication.

DESCRIPTION OF INVENTION

Figure 1:
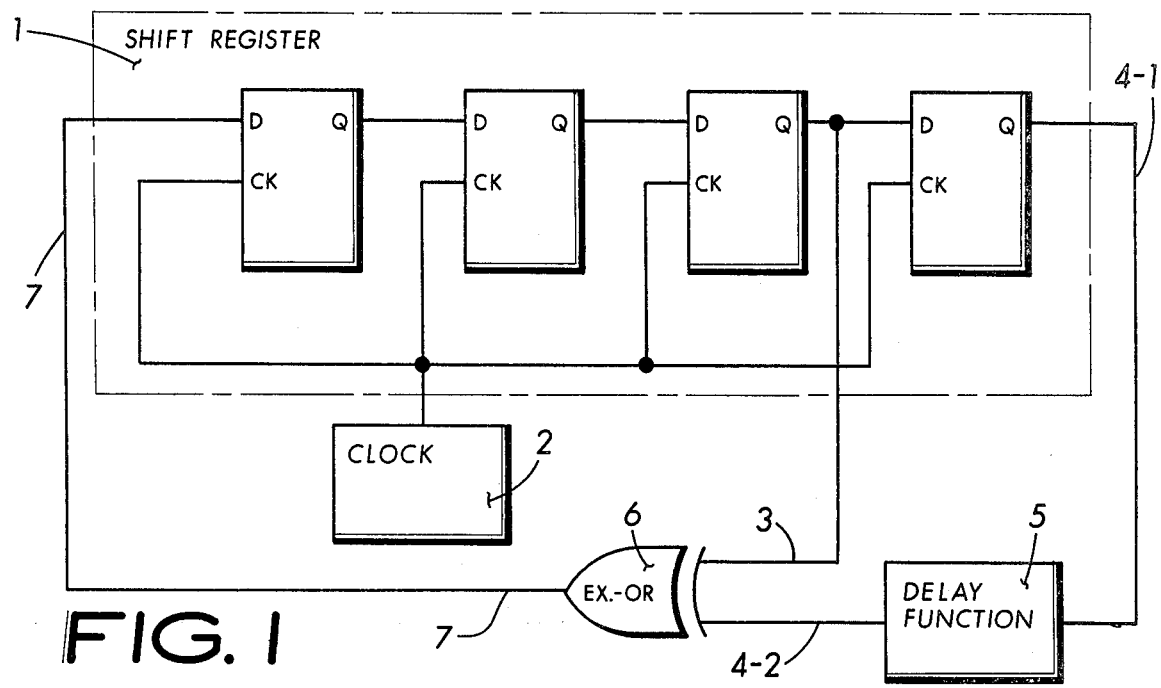
FIG. 1 Block diagram of essence of invention showing delay function coupled between shift register and logic.

FIG. 1 shows a four stage shift register 1 which may consist of serial coupled "D" type flip-flops. The shift register is advanced by the clock 2. The output is coupled from the third stage 3 and the fourth stage 4-1. The output 3 couples directly to an EXCLUSIVE-OR gate 6. However, the other output 4-1 couples to a delay function 5 which provides dynamic imbalance, with the output 4-2 therefrom coupling to the gate 6. The gate output 7 provides feedback to the DATA input of the shift register 1.

Figure 2:
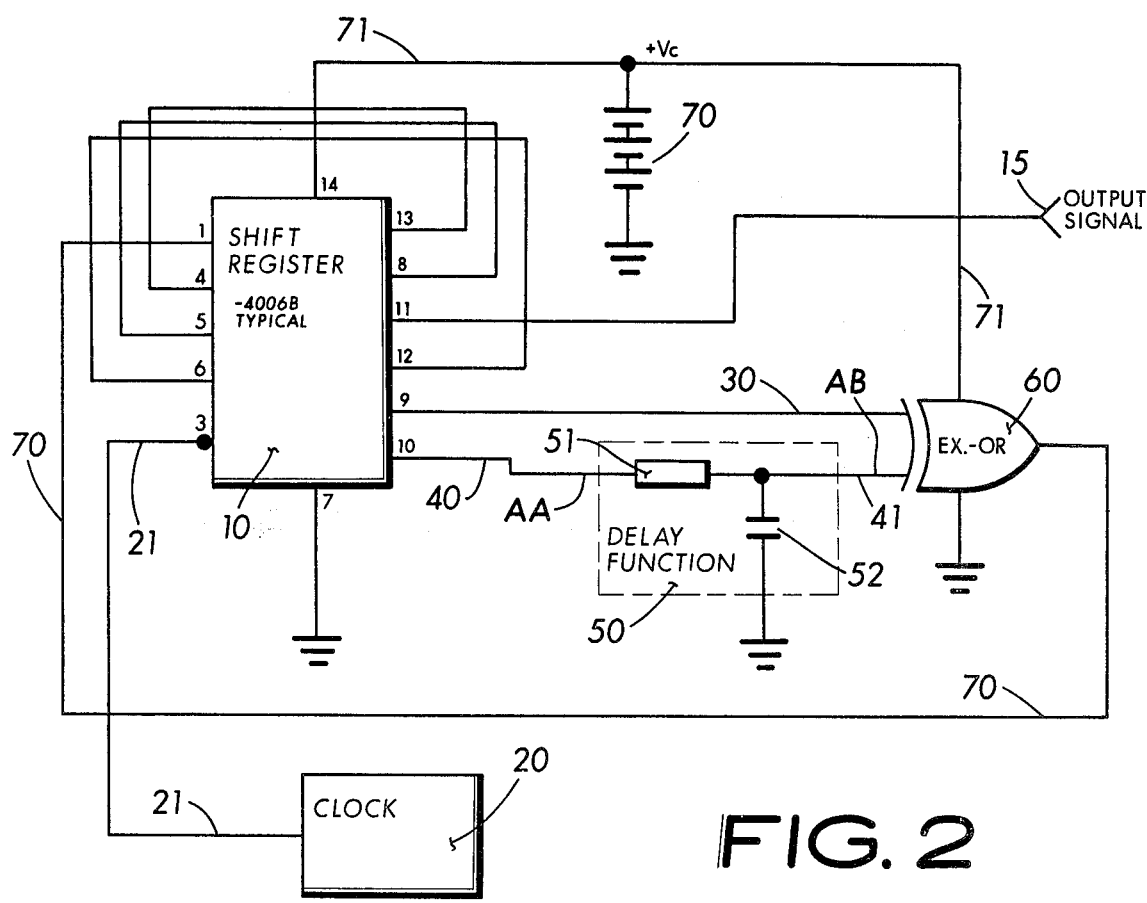
FIG. 2 Circuit for generator having RC delay function network.

A more particularly useful configuration is shown in FIG. 2 wherein a C-MOS type CD-4006B integrated circuit is connected as a seventeen stage recirculating shift register 10. A clock 20 couples 21 to the register. The outputs 30 and 40 couple from the effective fourteenth and seventeenth stages. The output 30 connects directly to an EXCLUSIVE-OR gate 60, whilst the other output 40 connects to the dynamic imbalance delay function 50, including resistor 51 and capacitor 52 acting as an integrator, serving to delay the output 41 connected to the gate 60 with respect to any signal on output 30. The gate output 70 returns to the register 10 input (pin 1 in this hookup). The resistor (R) 51 and capacitor (C) 52 act to provide a delay $T_D$ on the order of $$T_D \approx 2(R \cdot C) > 2 \ (1/F_{MAX})$$

related to the maximum clock frequency rate $F_{MAX}$. The output 15 provides a serial pseudorandom sequence. A power source 70 supplies $+V_c$ for operation 71.

Figure 3:
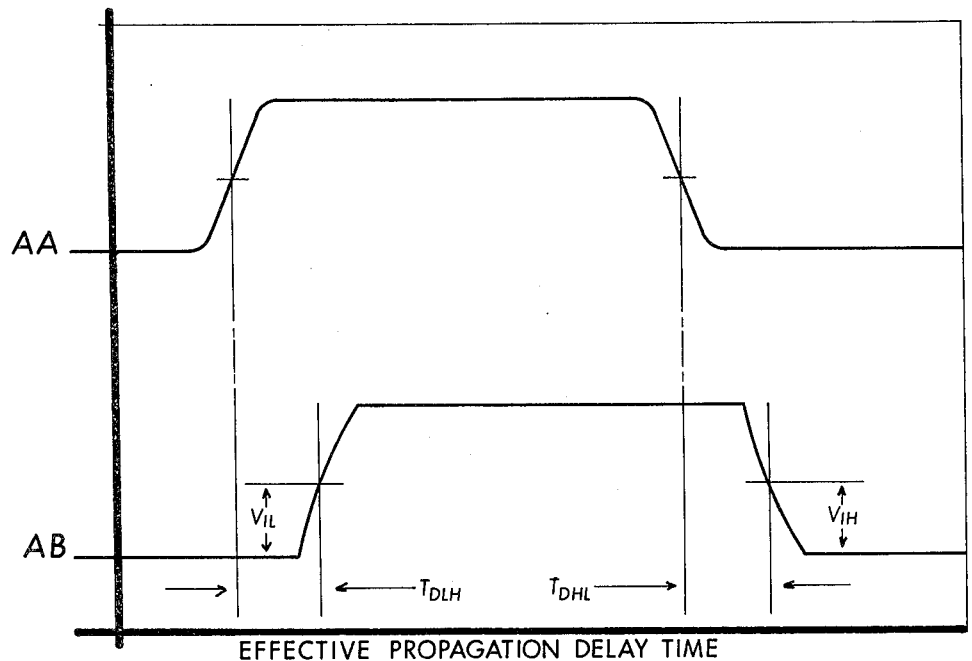
FIG. 3 Waveform detail for circuit of FIG. 2.

The waveforms of FIG. 3 shows the dynamic imbalance introduced by the delay effect of the network 50 in FIG. 2. Waveform AA is the typical shift register output 40. Waveform AB is the output 41 acted upon by the delay function 50. The delay from LOW state to HIGH state is shown $T_{DLH}$ to occur effectively between the approximate risetime midpoint of waveform AA and the gate 60 switching point $V_{IL}$. In a like way, the delay from HIGH state to LOW state $T_{DHL}$ is shown to coincide with the switching points $V_{IH}$ and are clearly shown delayed by the effective propagation delay time through the function 50.

Figure 4:
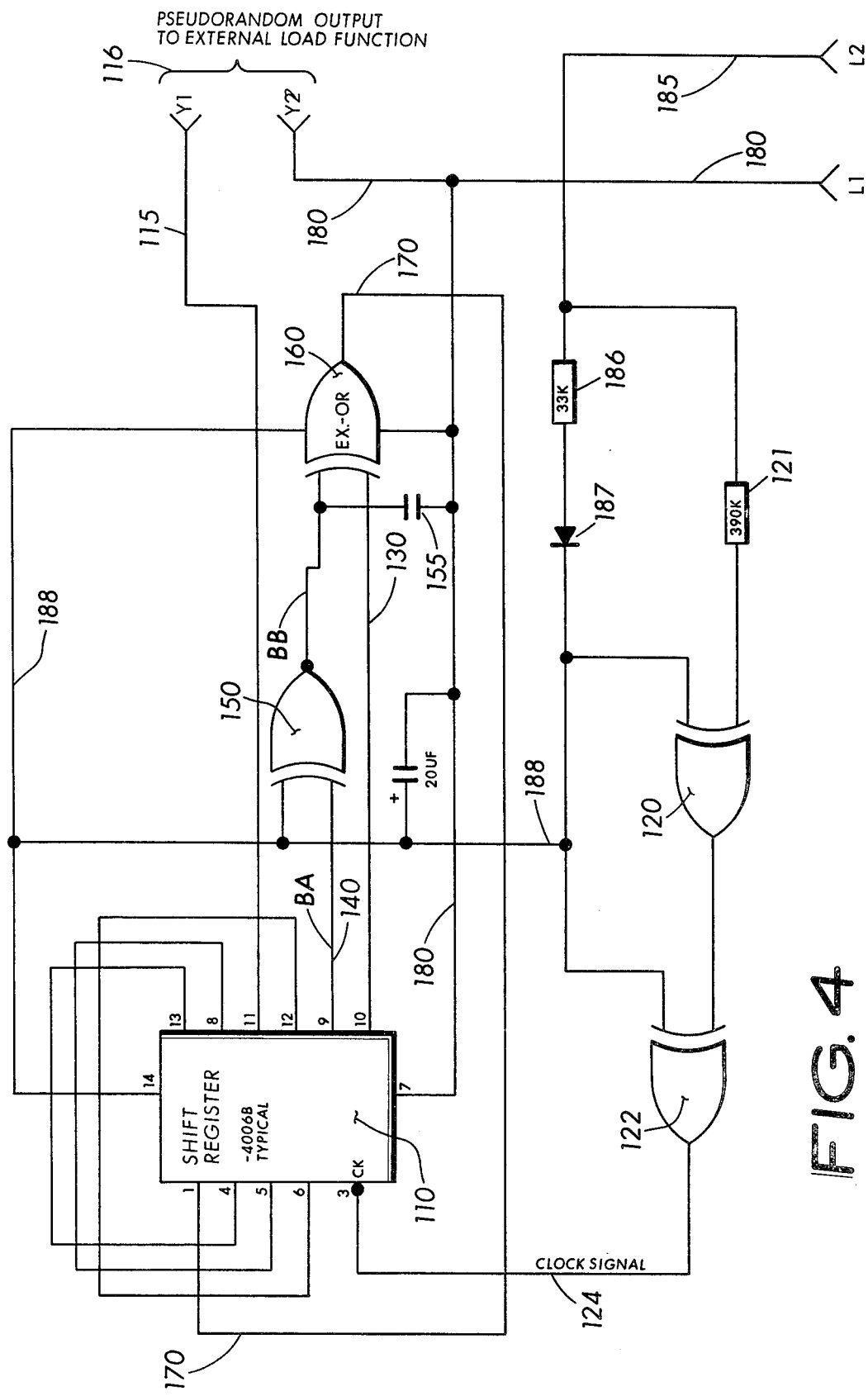
FIG. 4 Circuit for generator utilizing inherent propagation delay of logic device to acheive effect.

The essence of my teaching appears in yet another embodiment in FIG. 4. This form is particularly suited to monolythic fabrication as no R-C elements are used in the generator proper. Alternating current line power: viz 117 volts 60 hertz, is applied between inputs 180 and 185. The L1 input 180 acts as "common" and accordingly connects with the $V_{SS}$ terminals on the integrated circuit functions. The other L2 input 185 is "hot" and couples through a dropping resistor 186 and diode 187 to provide $V_{DD}$ levels 188 (+d.c. voltage) as coupled to the integrated circuits. A portion of the "hot" a.c. input 185 waveform also couples through resistor 121 to the input of a cascade pair of buffers 120, 122 acting as waveshapers to convert the 60 hertz a.c. waveform into 60 hertz suare wave clock 124 to couple to the register 110. A C-MOS type CD-4006B shift register acts as the central function of a direct coupled pseudorandom sequence generator providing an output 130 directly coupled to the EXCLUSIVE-OR gate 160, whilst the other output 140 couples through an inverter connected EXCLUSIVE-NOR gate 150 effective as a dynamic imbalance delay element, in turn coupled to gate 160. The gate 160 output 170 connects to the shift register 110 input for recirculation. The output connection 115 is developed 116 between the terminals Y1, Y2 which may control an external load means. The essence of this circuit which resists latchup is believed to be the dynamic imbalance brought about by the propagation delay of the BA output 140 prodcued by the inverter element 150. This inherent gate delay $t_{PHL}$ or $t_{PLH}$ is on the order of 100 to 200 nanoseconds which is longer than the set-up time $t_{SU}$ for the shift register. The effect of this delay may convienently be extended further by stretching the transistion time $t_{THL}$ and $t_{TLH}$ by a capacitor 155 as a load, providing a time delay of a microsecond or more.

It is my observation that this delay produces dynamic imbalance which enhances the circuits overall resistance to latchup and makes the circuit useful as an effective, low-cost way to generate a pseudorandom sequence for a variety of purposes. It is not to be interpreted that the circuit is absolutely immune to latchup, but rather that it is markedly more resistant to such a mode.

Figure 5:
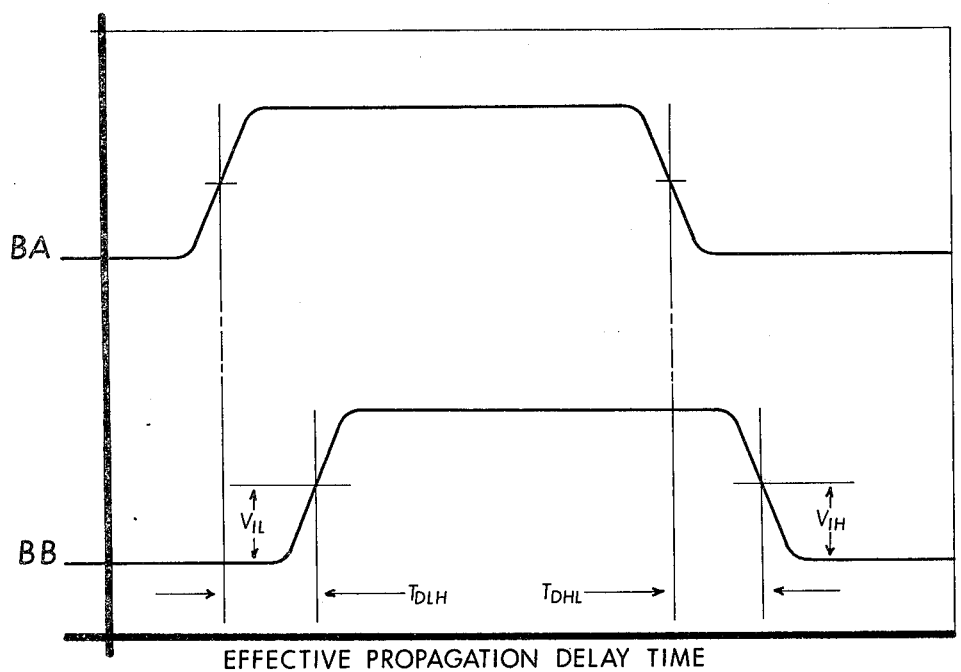
FIG. 5 Waveform detail for circuit of FIG. 4.

FIG. 5 shows some of the waveform detail attendant with FIG. 4. The register output BA waveform is reformed into waveform BB by the action of delay element 150. The times $T_{DLH}$ and $T_{DHL}$ correspond with the gate 150 propagation delays $t_{PLH}$ and $t_{PHL}$ respectively.

While I show particular shift register and logic elements, my invention is not limited to that choice alone, but may include any suitable logic elements coupled in a variety of configurations satisfying the intended purpose of providing a sequence generator having dynamic imbalance in the pseudorandom feedback loop.

While I show a resistor and capacitor combination as a delay element (item 50 in FIG. 2), the use of an inductor in place of the resistor, or of a lumped or distribuited delay line is to be within the scope of the teaching.

What I claim is:

1. A pseudorandom binary sequence generator including means adapted thereto for providing latchup resistance, including in combination:
   a. a source of clock signal;
   b. a shift register means coupled with said clock signal, having a data input thereto and plural stage outputs therefrom;
   c. dynamic imbalance means coupled to at least one said stage output and cooperative therewith to produce at least one delayed output therefrom exceeding intrinsic transmission gate delay but less than said clock signal period;
   d. combinational logic means directly coupled with two inputs between said stage output and said dynamic imbalance means output and an output coupled to said register data input, operative therebetween so as to produce a pseudorandom flow of binary pulses; and further,
   e. whereby resistance to latchup is provided through the effective dynamic imbalance introduced by the time delay of the signal flow coupled between at least one said stage output and the said logic means.

2. Generator of claim 1 whereby said dynamic imbalance means includes at least a capacitor and a resistor generally arranged as an integrator means coupled between at least one said register stage output and said logic means.

3. Generator of claim 2 whereby said integrator means provides an effective time constant about equal to:

$$R \cdot C > (1/F_{CK}).$$

4. Generator of claim 1 whereby said dynamic imbalance means includes the propagation delay $t_{PLH}$, $t_{PHL}$ of an integrated circuit logic stage which is usually longer than the register setup time $t_{SU}$.

5. Generator of claim 4 whereby said dynamic imbalance means includes the said propagation delay combined with extended transistion time $t_{TLH}$, $t_{THL}$ of the said logic stage produced by loading the output of the said logic stage with an effective capacitance.

6. Generator of claim 4 whereby said shift register, said dynamic imbalance means, and said combinational logic means are fabricated as a common integrated circuit embodiment.

7. Generator of claim 1 whereby said combinational logic means includes an EXCLUSIVE-OR function, with any instantaneous signal transistion present on at least one input thereto effectively delayed relative to at least another input thereto, resulting in dynamic imbalance.

8. Generator of claim 1 whereby said shift register includes at least two stages with at least two separate stage outputs therefrom; with at least one said stage output having a delay function coupled thereto; further including an effective EXCLUSIVE-OR gate function having at least two inputs thereto, with at least one said input coupled directly to a said stage output, with at least a second input coupled with said delay function; said gate function further having an output therefrom coupled directly with the DATA input of the said shift register.

9. Generator of claim 1 whereby said shift register includes at least two stages with at least two separate stage outputs therefrom; with at least one said stage output having a delay function coupled thereto; further including an effective EXCLUSIVE-NOR gate function having at least two inputs thereto, with at least one said input coupled directly to a said stage output, with at least a second input coupled with said delay function; said gate function further having an output therefrom coupled directly with the DATA input of the said shift register.

* * * * *